United States Patent [19]
Sugahara

[11] Patent Number: 5,464,014
[45] Date of Patent: Nov. 7, 1995

[54] DISPLAY DEVICE FOR BIOELECTRICAL AND BIOPHYSICAL PHENOMENA

[75] Inventor: Tomio Sugahara, Minami-Morimachi, Japan

[73] Assignee: Sugan Company Limited, Osaka, Japan

[21] Appl. No.: 60,220

[22] Filed: May 7, 1993

Related U.S. Application Data

[63] Continuation-in-part of Ser. No. 826,890, Jan. 29, 1992, Pat. No. 5,239,265.

[30] Foreign Application Priority Data

Oct. 3, 1991 [JP] Japan .................................. 3-283990
Mar. 18, 1993 [JP] Japan .................................. 5-085747

[51] Int. Cl.⁶ ........................... A61B 5/044; A61B 5/055
[52] U.S. Cl. .................................. 128/653.2; 128/653.5; 128/710; 340/573; 345/1
[58] Field of Search ........................... 128/653.2, 653.5, 128/709, 710; 324/309, 318, 322; 340/573, 716; 378/4; 345/1

[56] References Cited

U.S. PATENT DOCUMENTS

| | | | |
|---|---|---|---|
| 4,356,475 | 10/1982 | Neumann et al. | 128/709 |
| 4,378,021 | 3/1983 | Strand | 128/709 |
| 4,777,438 | 10/1988 | Holland | 324/318 |
| 4,794,532 | 12/1988 | Leckband et al. | 128/709 |
| 4,901,141 | 2/1990 | Costello | 128/653.2 |
| 5,038,785 | 8/1991 | Blakeley et al. | 128/653.2 |
| 5,076,275 | 12/1991 | Bechor et al. | 128/653.2 |
| 5,134,373 | 7/1992 | Tsuruno et al. | 128/653.5 |
| 5,184,074 | 2/1993 | Kaufman et al. | 324/318 |
| 5,239,265 | 8/1993 | Sugahara | 324/309 |
| 5,265,610 | 11/1993 | Darrow et al. | 128/653.2 |

OTHER PUBLICATIONS

Rokey et al., "Monitoring of Acutely Ill Patients During Nuclear Magnetic Resonance Imaging: Use of a Time-Varying Filter Electrocardiographic Gating Device to Reduce Gradient Artifacts", Magnetic Resonance in Imaging vol. 6, Feb., No. 2, 1988, pp. 240–245.

*Primary Examiner*—Krista M. Zele
*Attorney, Agent, or Firm*—Lockwood Alex Fitzgibbon & Cummings

[57] ABSTRACT

Disclosed is a display device which receives and displays ECG and other signals from a patient in an MRI (magnetic resonance imaging) control room, which display device comprises a video converter which outputs video signals corresponding to the displayed information, a magnetically shielded cable which transmits the output of the video converter to a location near the patient and a display unit which receives the video signals from the magnetically shielded cable and display ECG and other data in a location near the patient as accommodated in a magnetically shielded housing. With this display device, ECG and other signals can be monitored accurately within the MRI booth without adverse effects on the MRI unit.

1 Claim, 7 Drawing Sheets

DISPLAY DEVICE FOR BIOELECTRICAL AND BIOPHYSICAL PHENOMENA

CROSS-REFERENCE TO RELATED APPLICATIONS

This is a continuation-in-part application of U.S. patent application Ser. No. 826,890 filed Jan. 29, 1992, now U.S. Pat. No. 5,239,265.

BACKGROUND OF THE INVENTION

1. Field of the Invention

This invention relates to a device ancillary to a magnetic resonance imaging (MRI) system and more particularly to a display device through which the physician may monitor bioelectrical and biophysical phenomena in a patient realtime while scanning the patient with an MRI system in an MRI booth.

2. Description of the Related Art

The magnetic resonance imaging system has been proposed as a device for visualizing axial, coronal and sagittal sections of a patient's body without exposing the patient to radiation. The principle of this system comprises applying an electric wave energy (RF pulses) to a human body located in a strong magnetic field to cause the atomic nuclei to resonate in the body to form an image. Thus, when such nuclei within the body placed in a homogeneous magnetic field absorb energy from electric waves of a given wavelength, they release back the energy once absorbed and accumulated. The MRI is a device which constructs an image based on the above effect. While the atomic nucleus is usually $H^1$, it may also be $^{13}C$, $^{19}F$, $^{23}Na$, $^{31}p$ or the like.

Figure 4:
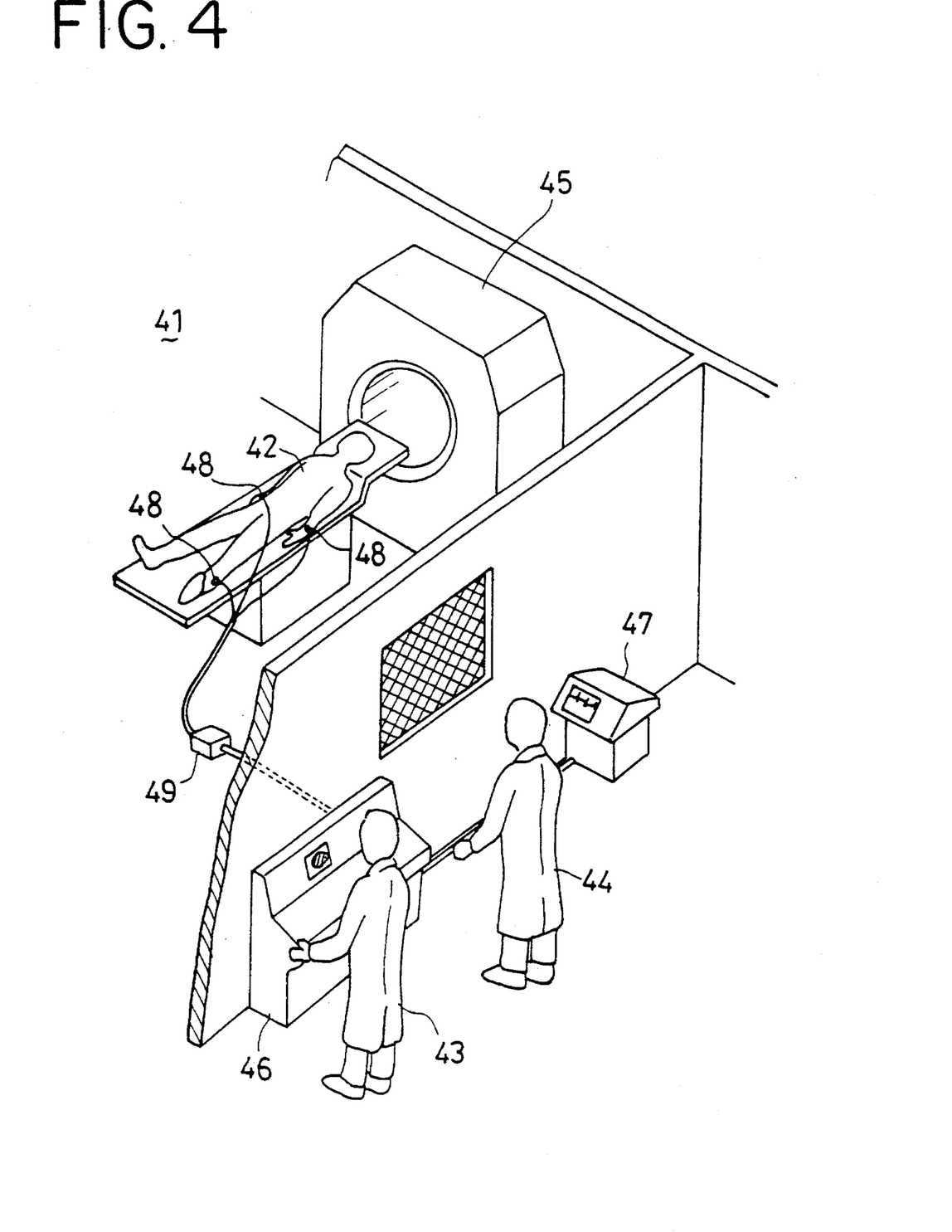
FIG. 4 is a schematic view illustrating the tomographic imaging operation in the conventional system.

FIG. 4 is a schematic diagram showing the manner in which the MRI device is used, where a technician 43 and a physician 44 are constructing an MRI tomogram of a patient 42 under constant monitor of the patient's condition in an MRI booth 41.

The magnetic resonance imaging system comprises an MRI unit 45, which employs a superconductive magnet or electromagnet, and an MRI control 46 which displays a tomogram and other information under the control of the technician 43. In order that a reliable tomogram may be constructed, there must be provision for protecting the magnetic field in the MRI booth 41 against external perturbations. Therefore, the MRI booth 41 is meticulously protected with a magnetic shield.

In operating the magnetic resonance imaging system, the patient's physiological status must be fully monitored. Therefore, a display monitor 47 is disposed near the physician 44 so that the physician 44 may have ready access to the electrocardiogram and, where necessary, the pulse wave signals and blood pressure signal waves of the patient. In the system illustrated in FIG. 4, only electrodes 48 attached to the patient's limbs for the detection of myocardial action potentials and a preamplifier 49 for amplifying the outputs of said electrodes 48 are shown and the sphygmomanometer and other instruments are not shown.

The physician 44 evaluates the physiological status of the patient 42 according to the waveforms and other data on the display monitor 47 and instructs the technician 43 on the operation of the MRI control 46. Assuming that the patient has a heart disease, the electrocardiogram, blood pressure and pulse rate are constantly monitored and if any ECG abnormality is discovered, an instruction is given to immediately stop the operation of the MRI unit 45.

However, the system shown in FIG. 4, wherein the physiological condition of a patient is monitored in a separate room independent of the MRI booth, has various drawbacks. Thus, since the physician is monitoring the patient's condition on the display monitor 47 which is located in the separate room, he cannot rush to the patient in the event of onset of a sudden abnormality in the patient with the result that institution of a pertinent remedy is delayed. Moreover, even in the absence of such a sudden abnormality, the patient left alone in the isolated noisy MRI booth often experiences anxiety and fear. Therefore, if possible, it is most desirable that the physician is attendant close by the patient throughout the diagnostic procedure.

In order that the physician may attend the patient at all times during diagnosis, it is necessary that the patient's physiological status be monitored within the MRI booth. To do this, however, the following problems must be solved for bringing the monitor display into the MRI booth.

(1) If other instruments are unscrupulously brought into the MRI booth, the magnetic field within the booth will be disturbed by influences of such instruments to interfere with the construction of a reliable tomographic image. Thus, there must be no generation of electric and other noise from instruments installed near the patient and the MRI unit. If, for example, the display monitor 47 is installed in the MRI booth, the MRI unit will fail to output accurate image data and increase the risk of a wrong diagnosis.

(2) The cathode-ray tube of the display monitor 47 is directly subject to influences of the magnetic field. Therefore, if a display device utilizing a cathode-ray tube is installed in the MRI booth, the device will naturally fail to display true waveforms. Even if the display device is not a device having a cathode-ray tube, the strong magnetic field in the MRI booth may still interfere with the display waveforms.

Figure 5A:
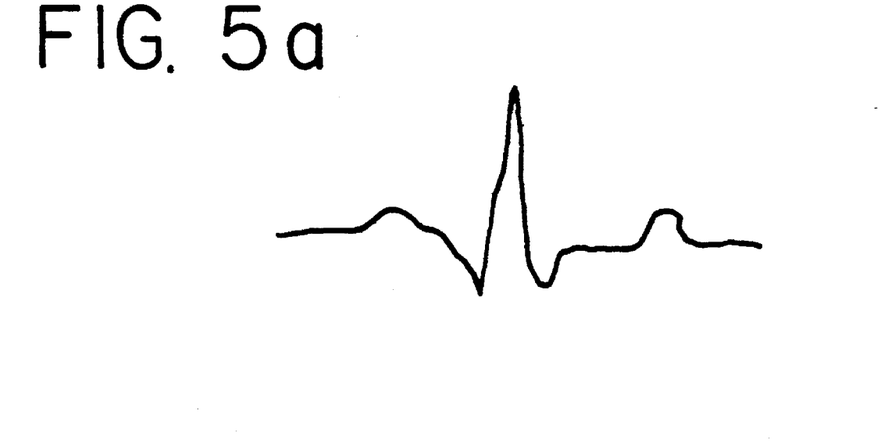
FIG. 5a, 5b and 5c is a diagrammatic representation of ECG waveforms.
Figure 5B:
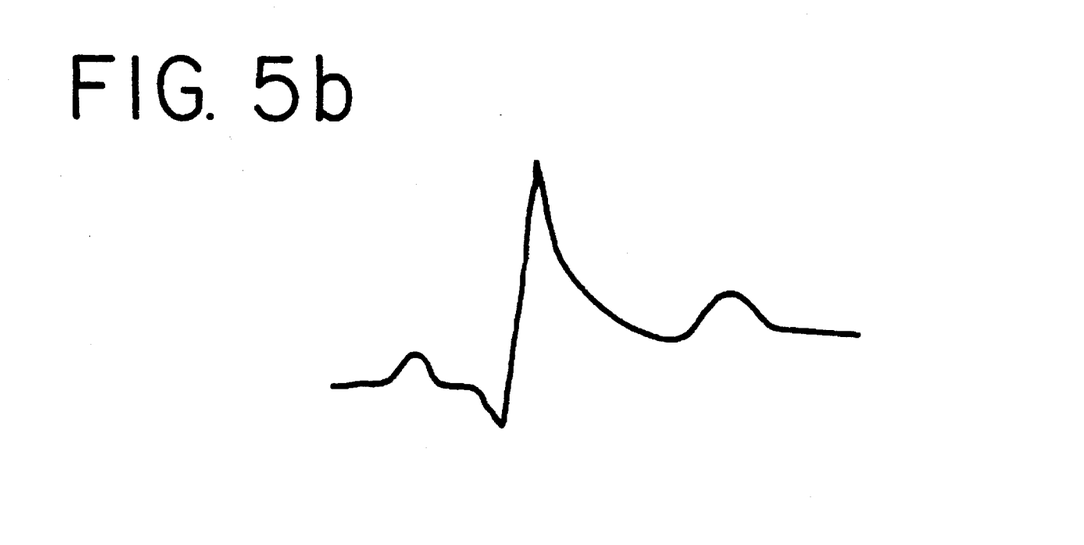
Figure 5C:
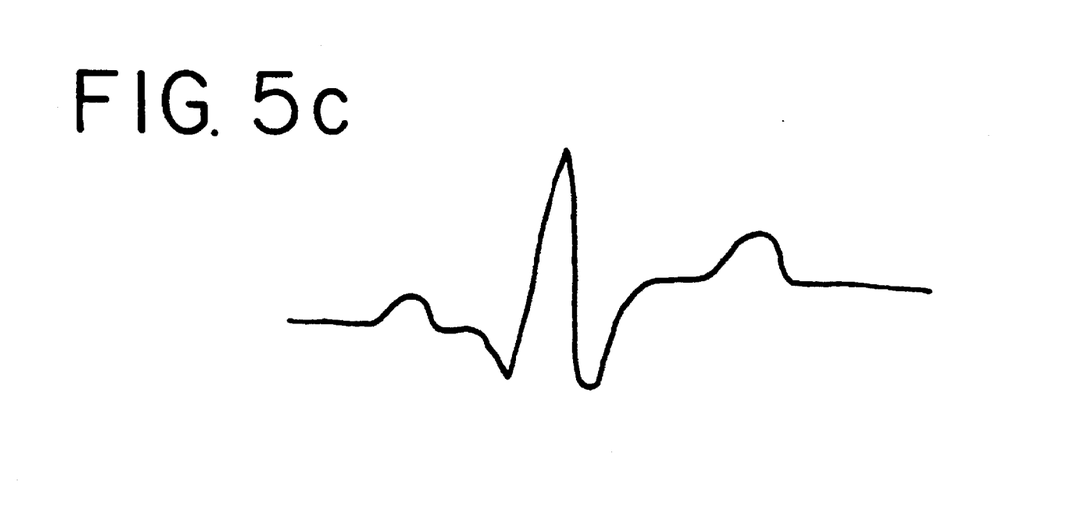
Figure 6A:
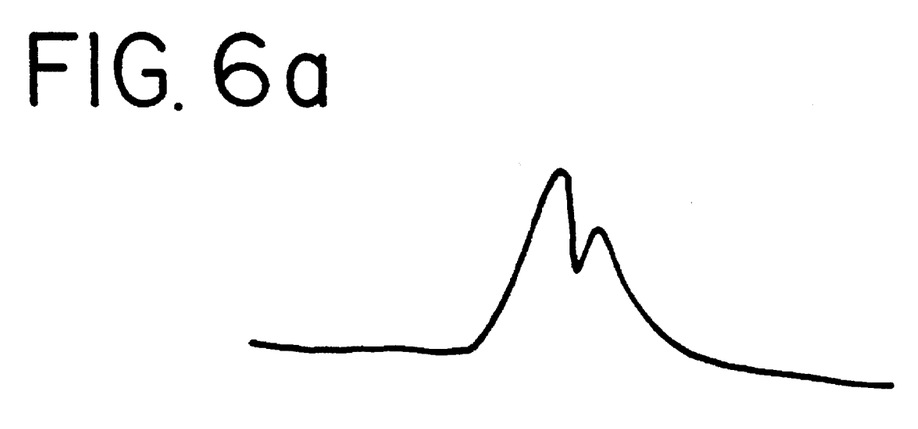
FIG. 6a–6b is a diagrammatic representation of blood pressure signal waveforms.
Figure 6B:
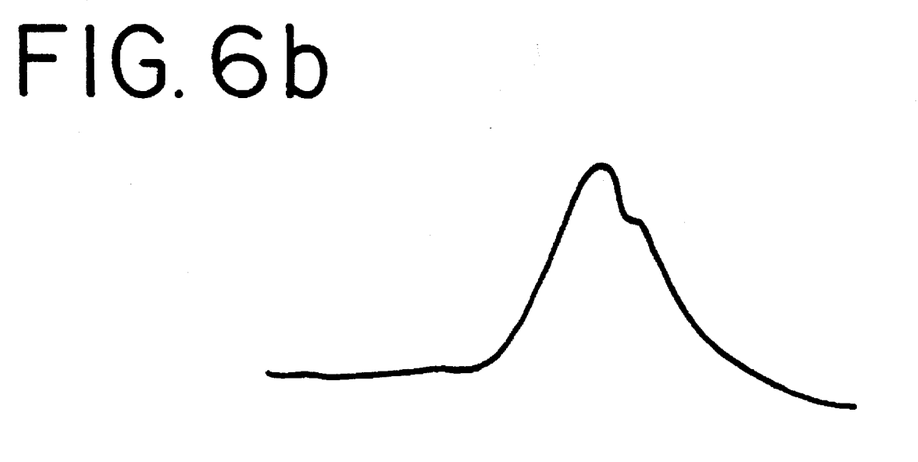

FIG. 5 shows a normal ECG (a), an ECG (b) recorded in a patient who has a history of myocardial infarction which is still persistent and an ECG (c) recorded in a patient which has myocardial infarction as a present illness. FIG. 6 shows a standard intraarterial waveform (a) characterized by two peaks and a blood pressure waveform (b) recorded in a patent with aortic valve disease. As will been seen from FIGS. 5 and 6, the difference between the normal waveform and the abnormal waveform is subtle and, moreover, the abnormal waveform can be of several types. Therefore, to prevent a wrong diagnosis, it is necessary that the ECG signals and blood pressure signals derived from the patient be displayed with the greatest fidelity.

(3) The wall isolating the MRI booth from the MRI control room must be strictly shielded electrically and magnetically. Therefore, it is difficult to lead many conductors into the MRI room. For example, it is impossible to transmit the ECG and blood pressure signal outputs from the auxiliary terminals of the display monitor independently into the MRI booth. It might be contemplated to use a single conductor on a time sharing basis for the transmission of the plurality of signals but the pulse signal necessary for timesharing of the conductor would adversely affect the constructed image. Therefore, such a schema would not be a pertinent solution. Furthermore, the wiring between the MRI booth and the MRI control room is routed through an electromagnetically shielded under-floor box along the walls of the respective rooms and may be as long as about 15 meters and in this respect, too, it is not a valid procedure to lead feeble ECG and other signals into the MRI booth.

Having been accomplished in view of the above problems, this invention has for its object to provide a display device by which ECG, blood pressure and other signals can be accurately monitored within the MRI booth and which does not exert adverse influences on the MRI device.

SUMMARY OF THE INVENTION

Designed to accomplish the above-mentioned object, the display device for bioelectrical and biophysical phenomena according to this invention comprises (a) a converting means which receives signals representing the physiological condition of a patient in a location which is free from influences of the magnetic resonance imaging device, displays time-serial changes in said signals and outputs transmission signals corresponding to the displayed data, (b) a transmitting means which transmits said transmission signals to a location close to said patient, and (c) a display means accommodated in a electromagnetically shielded housing for receiving said transmission signals from said transmitting means, subjecting the signals to a pertinent transformation and displaying signals representing the physiological condition of the patient.

DETAILED DESCRIPTION OF THE PREFERRED EMBODIMENTS

Figure 1A:
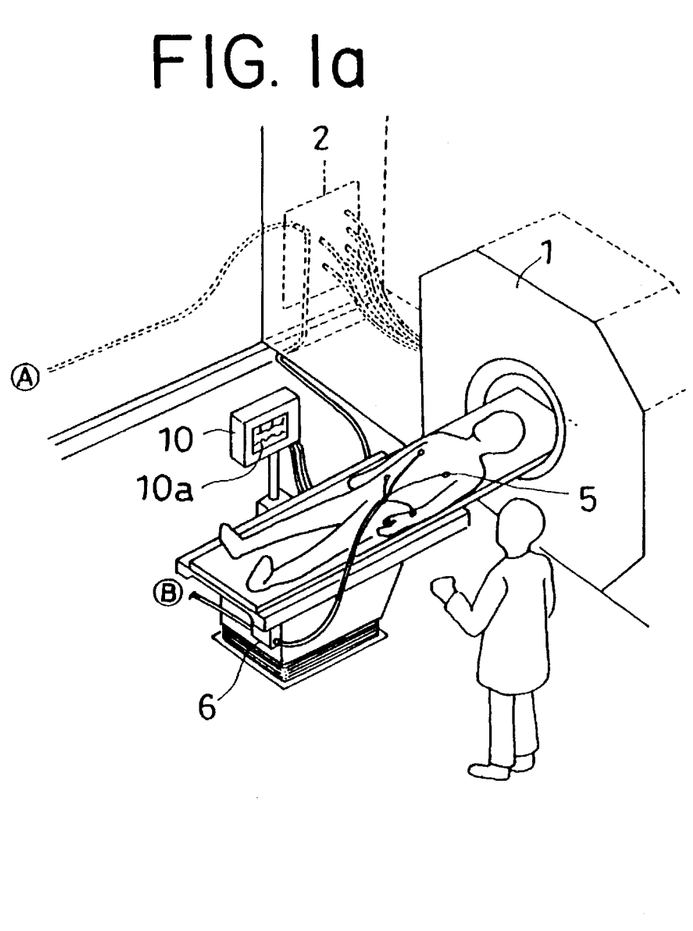
FIG. 1a–1b is a schematic view showing the display device for bioelectrical and biophysical phenomena according to this invention.
Figure 1B:
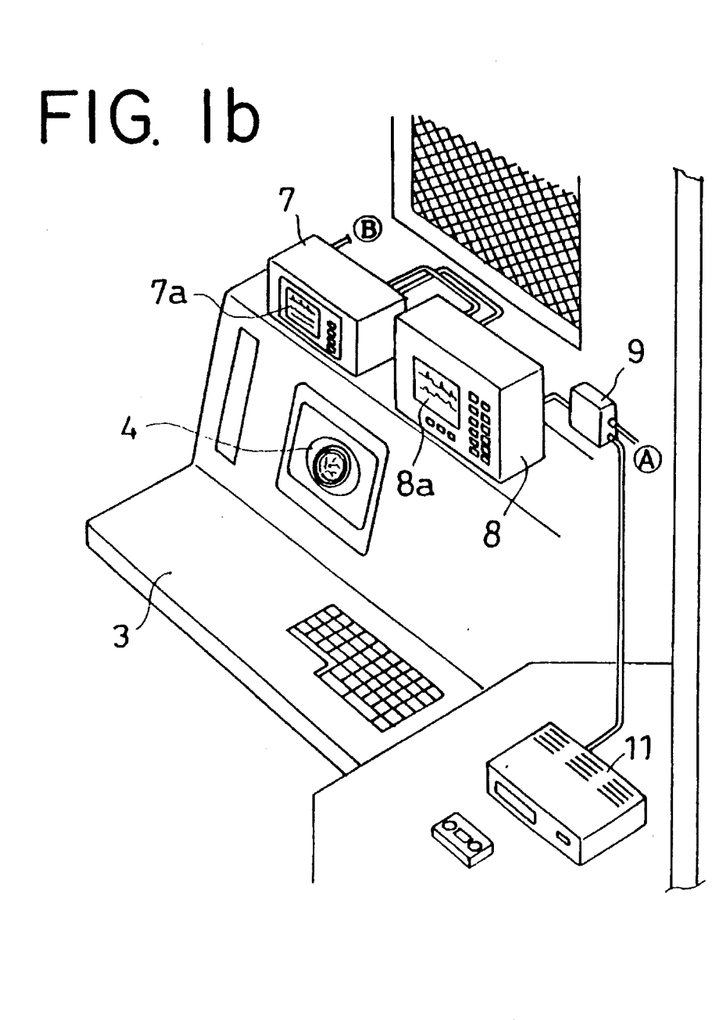

FIG. 1 is a schematic view showing the display device for bioelectrical and biophysical phenomena as an embodiment of the invention. Thus, FIG. 1 (a) shows a MRI booth in which a physician is attending his patient and FIG. 1 (b) shows an MRI control room in which the MRI tomogram, electrocardiogram, etc. are displayed.

Installed in the MRI booth is an MRI unit 1 which is connected through an interface box 2 to an MRI control 3 in the control room. The tomogram 4 is displayed at the MRI control 3.

Attached to the patient in the MRI booth are electrodes 5 for ECG recording and the ECG signals derived through the electrodes 5 are amplified by a preamplifier 6 and fed to a display monitor 7. Though not shown, a hemomanometer and a sphygmograph are also connected to the patient and the signals obtained by these instruments are also fed to the display monitor 7.

The display monitor 7 is of the known type and displays the ECG, hemomanometer and sphygmograph output signals on a display device 7a, such as a cathode-ray tube. The auxiliary terminals of the display monitor 7 are connected to the input terminals of a video converter 8 so that the ECG, blood pressure and other signals derived from the auxiliary terminals are fed to the video converter 8.

The video converter 8 converts ECG, blood pressure and other signals to NTSC (National Television System Committee) video signals and outputs them and, at the same time, it displays the ECG, blood pressure and other signals on an optional scale on a built-in display 8a.

The NTSC video signal output of the video converter 8 is fed to a display device 10 in the MRI booth through a switch box 9 and an interface box 2. Therefore, an image similar to the images on display 7a and display 8a is displayed on the display device 10 so that the physician may have constant tabs on the physiological condition of the patient. Incidentally the connecting cable is hermetically shielded to prevent leakage of NTSC video signals.

The display device 10 comprises a signal converting block which receives NTSC video signals and a display block 10a. The display block 10a may, for example, comprise a liquid crystal display, a plasma display panel or an electroluminescence (EL) display. The signal converting block receives NTSC video signals through the connecting cable and converts the signals according to the type of display block 10a.

The housing of the display device 10 is rigorously shielded magnetically with a diamagnetic material such as copper or stainless steel sheet so that irrespective of whether the MRI unit 1 is active or not, the display on the display device 10 is not affected by the magnetic field, nor is the MRI unit 1 affected by NTSC video signals.

The switch box 9 is connected to a home video TV 11, too, and by manipulating a switch in the switch box 9, a video image can be displayed on the video device 10. The video image is used for the purpose of relaxing the patient, for example in the operation of the MRI unit 1.

Figure 2:
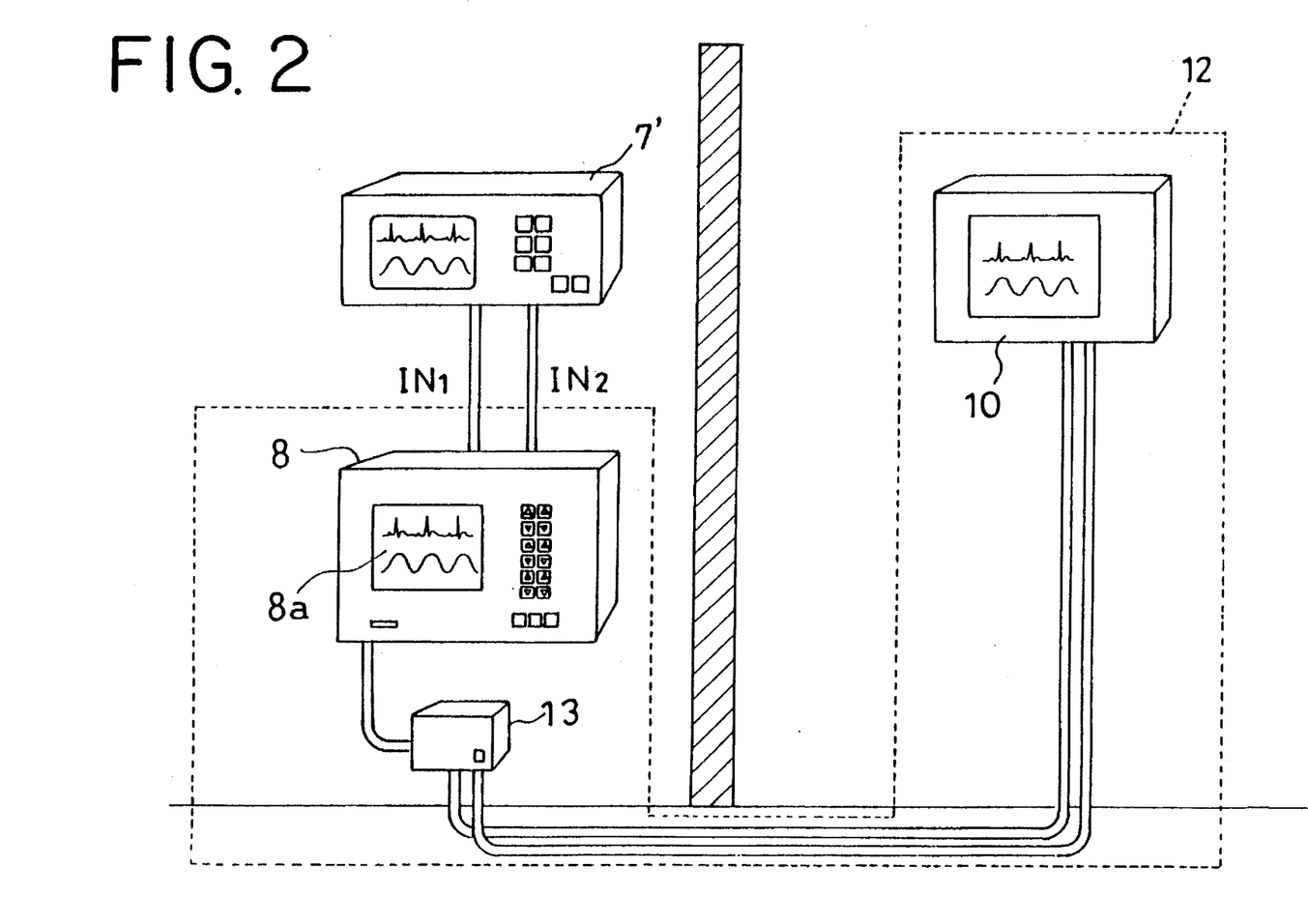
FIG. 2 is a schematic view showing another embodiment of the invention.

FIG. 2 is a diagrammatic view of another embodiment of this invention, showing the mode of connection between an ECG monitor 7', which is an example of said display monitor, and the display device 12 for bioelectrical and biophysical phenomena according to the invention. As shown in FIG. 2, this display device 12 for bioelectrical and biophysical phenomena comprises a video converter 8, a relay box 13 and a display 10. The display 10 is magnetically shielded and installed in the MRI booth, while the other components are installed in the control room.

The video converter 8 receives the ECG signal IN1 and blood pressure signal IN2 from the ECG monitor 7', converts these signals to NSTC video signals and outputs them to the relay box 13. The relay box 13 outputs a source voltage for the display 10 and said NSTC video signals for transmission to the display 10. Though the relay box 13 is shown in FIG. 2 as installed outside the MRI booth, it can be installed within the MRI booth if it is provided with a thorough magnetic shield.

Figure 3:
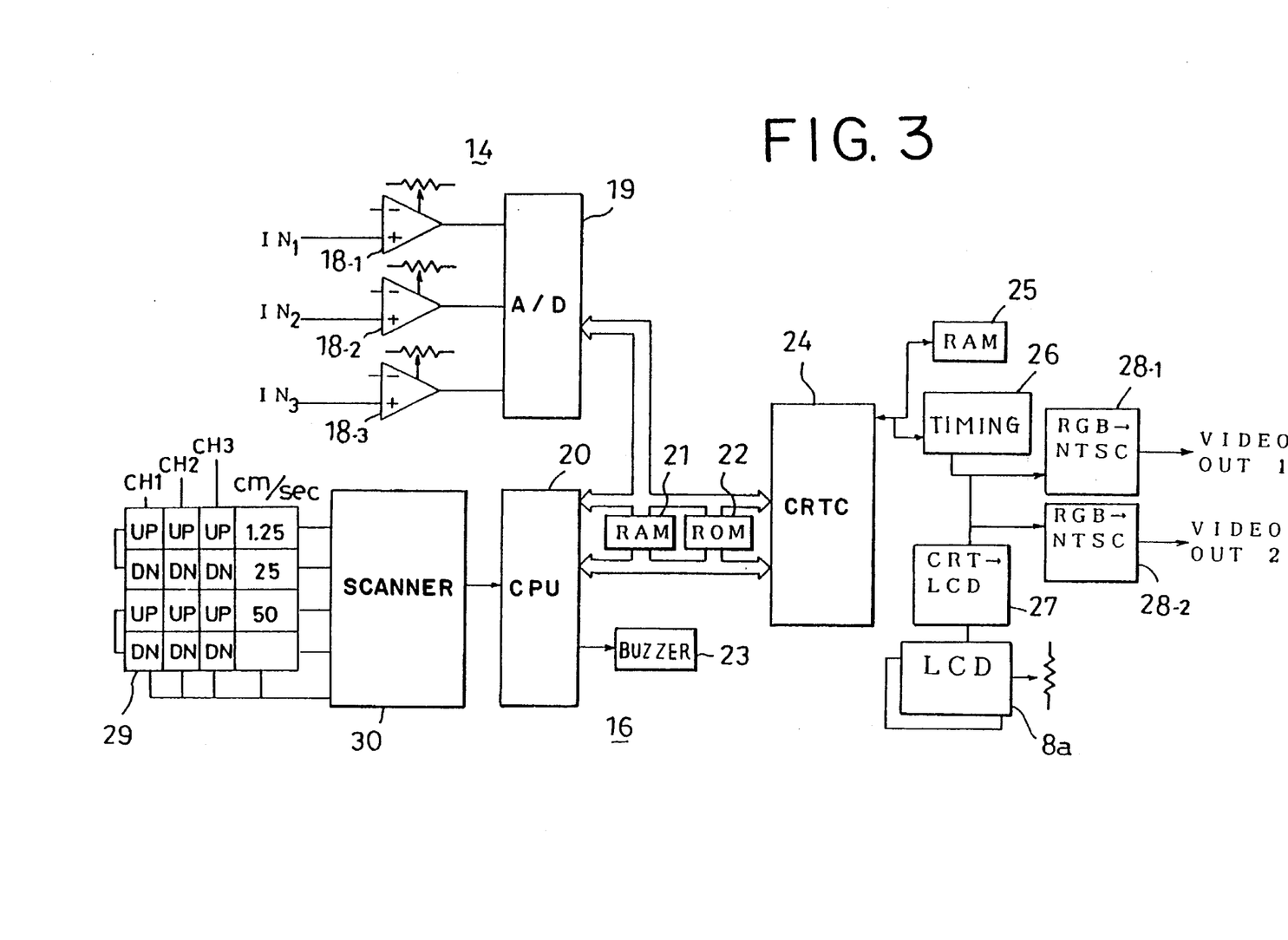
FIG. 3 is a block diagram of a video converter as a component of the display device.

FIG. 3 is an internal block diagram of the video converter 8 shown in FIGS. 1 and 2. This video converter 8 comprises an input block 14 which receives the ECG signal IN1, blood pressure signal IN2 and pulse wave signal IN3, a switchboard 15, a controller 16 and an NTSC signal converting block 17.

The input block 14 comprises buffer amplifiers $18_{-1}$ through $18_{-3}$ and an A/D converter 19. The A/D converter 19 converts the ECG signal IN1, blood pressure signal IN2 and pulse wave signal IN3 to digital data. The gains of buffer amplifiers $18_{-1}$–$18_{-3}$ are adjustable.

The controller 16 comprises a CPU20, a RAM21 and a

ROM22, among other components. The CPU20 functions according to a program stored in ROM22 to control the actions of various parts of the device and stores the digital data output of A/D converter 19 in RAM21. In the event an abnormality develops, a buzzer alarm 23 sounds.

The NTSC signal converting block 17 comprises a CRT controller 24, a graphic RAM25, a timing circuit 26, an LCD (liquid crystal display) controller 27, an LCD display 8a and NTSC converters $28_{-1}$ and $28_{-2}$. The CRT controller 24 functions according to the digital data stored in RAM21 to prepare image information for display on the CRT screen and the NTSC converters $28_{-1}$ and $28_{-2}$ convert this image information to NTSC video signals and output the video signals. One of said NTSC converters is a backup converter.

The LCD controller 27 converts the image information to signals for LCD display and drives the LCD display 8a. In this manner, the ECG, blood pressure and other signals corresponding to said NTSC video signals are displayed on the LCD display 8a.

The switchboard 15 comprises key switches 29 and a scanner 30 which detects the ON/OFF status of key switches 29. The key switches 29 are used in designating the scale (sensitivity) and position of, for example, an electrocardiogram to be displayed on LCD display 8a. Thus, the operator manipulates up-switches UP and down-switches DN as necessary to designate the sensitivity and position of ECG or other signals [CH1–CH3]. The key switches 29 are further provided with switches for designating an enlargement or reduction on time axis of the display waveform so that the display speed can be set to any of 1.25 cm/sec., 25 cm/sec and 50 cm/sec.

The CPU20 controls the various parts of the device according to the ON/OFF status at the keyboard 29 so that the information displayed on the LCD display 8a and the display device 10 in the MRI booth is varied according to the operator's command.

Meanwhile, in the MRI control room, signal waveforms of the same kind are displayed on both the display monitor 7 and LCD display 8a and this might be considered a wasteful lavishment [FIG. 1 (b)]. However, ECG, blood pressure and other waveforms are very important and it is often desirable to have the entire waveform displayed on the display monitor 7 and, at the same time, a given part of the waveform displayed on an exaggerated scale on the LCD display 8a. Therefore, actually this provision of two kinds of displays is instrumental. Moreover, it is often desirable that the signal waveform demanded by the physician may be displayed according to his instruction from the MRI booth. Furthermore, this provision of two displays is beneficial also for aiding in the discovery of a failure of the converter 8. It may also be useful to connect the operator in the control room with the physician in the MRI booth through a voice circuit so that they may freely converse with each other. In this case, since the voice signals and NTSC video signals can be transmitted on the same line, there is no restriction on the interface box 2, nor is there a magnetic shield problem.

Figure 7:
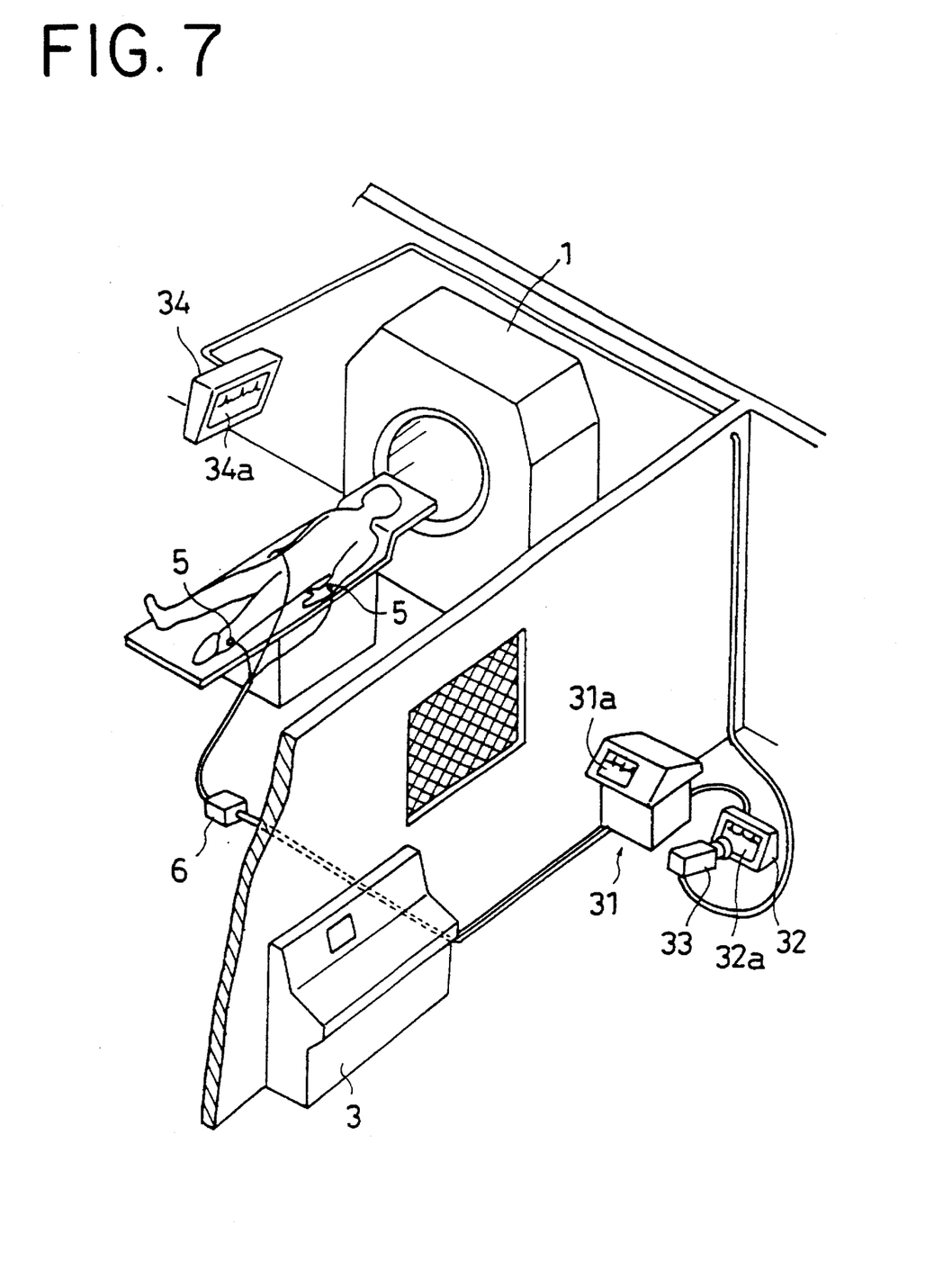
FIG. 7 is a schematic view showing still another embodiment of the invention.

FIG. 7 shows still another embodiment of this invention. This embodiment comprises an examination unit 31 which receives ECG and other signals, a display unit 32 which displays ECG and other data, a video photographing unit 33 and a video signal display unit 34, among others.

The examination unit 31 has a display 31a which may be a cathode-ray tube, a liquid crystal panel or the like and displays ECG and other vital signs of the patient in the analog format.

The display unit 32 is connected to the examination unit 31 and its display 32a indicates a waveform of the same kind as that on the display 31a. The displays 31a and 32a are arranged side by side partly for allowing the operator of the MRI control to easily monitor the physiological condition of the patient and partly because it is convenient to display the same waveform on different enlargement/reduction scales. If necessary, the display unit 32 may be omitted and instead it may be so arranged that the display 31a of the examination unit 31 is photographed with the video camera 33.

In either case, video signals corresponding to the image on the display 31a or 32a are obtained from the video camera 33 and fed to the video signal display device 34 within the MRI booth. As the patient's ECG and blood pressure waveforms are displayed real-time on the video signal display device 34 in this manner, the physician in the MRI booth can be fully cognizant of the physiological status of the patient.

While a few embodiments of this invention have been described above, the display device for bioelectrical and biophysical phenomena according to this invention is not limited to those embodiments but can be modified as desired without departing from the scope of the claims.

For example, the embodiments shown in FIGS. 1 through 3 utilize the ECG signals and blood pressure signals derived from the auxiliary terminals of the existing display monitor 7 but the ECG signals available from the electrodes attached to the patient, for instance, may be directly fed to the video converter 8. Of course, since the video converter 8 must then be directly connected with the patient, provision is necessary for preventing shock due to a leak current. However, as safety requirements impose various restrictions on the circuit, the production cost will then be increased. Therefore, this approach is not necessarily valid. Thus, when the existing display monitor is utilized as shown in FIGS. 1 through 3, the physiological status of the patient can be fully monitored with the simple circuit configuration with considerable advantage.

In the above embodiments, the video converter outputs NTSC video signals but this is not an exclusive arrangement. Thus, for example, PAL (phase alternating line) video signals can be utilized. Moreover, ECG signals and blood pressure signals indicating the physiological condition of the patient may be sampled and coded and transmitted by a PCM (pulse code modulation) system. In this case, the display device 10 must be provided with a recognizing circuit corresponding to the transmission system used. Moreover, the transmission need not be limited to electric signals and a light signal carrier may be modulated with an ECG or blood pressure and other signals transmitted to the display device 10 via a fiber cable.

The magnetic-shielded cable and fiber cable have been referred to in the forgoing description but a light transmission system which does not require wiring may be employed. For example, since a window for monitoring the patient is available between the MRI booth and the control room, a light transmitter and a light receiver may be juxtaposed across the window for the transmission and reception of ECG and blood pressure and other signals. The light signal carriers which can be used for this purpose may be infrared rays or laser beams. Since this communication system does not produce an electric noise, there will be no adverse effect on the MRI unit.

The display device for bioelectrical and biophysical phenomena according to this invention is applicable to magnetic resonance spectrometry (MRS).

Having the construction described hereinbefore, the display device for bioelectrical and biophysical phenomena according to this invention offers the following characteristic advantages.

In the construction of a tomogram using a magnetic resonance imaging system, the vital signs of the patient can be monitored within the MRI booth so that the physician can attend the patient in a close-by position and take any necessary procedure in a timely manner.

There is a further advantage that since the physician can attend the patient in the MRI booth, the imaging procedure may be started after applying a pertinent exercise load to the patient and even a therapy may be administered in the MRI booth.

Another advantage is that the existing ECG monitor and the like can be utilized and the cost of facility remodeling is minimal.

What is claimed is:

1. A display device for vital signs of a patient during magnetic resonance imaging of the patient with an MRI system which comprises:

means receiving signals representing the physiological status of the patient, said signal receiving means being in a location not subject to influences of the MRI system, said device including first display means which displays information which indicates time-serial changes in said signals and outputs transmission signals corresponding to the information so displayed, transmitting means which transmits said transmission signals to a location close to the patient, and second display means accommodated in a magnetically shielded housing located close to the patient which receives said transmission signals from said transmitting means, converting them to signals indicating the physiological condition of the patient, wherein said first display means which receives signals representing the physiological status of the patient in a location which is not subject to influences of said magnetic resonance imaging system and displays time-serial changes in said signals further includes a photographing means which photographs the images displayed on said first display means and outputs video signals.

* * * * *